(12) United States Patent
Nam

(10) Patent No.: US 10,332,933 B2
(45) Date of Patent: Jun. 25, 2019

(54) ELECTRONIC DEVICE AND METHOD FOR FABRICATING THE SAME

(71) Applicant: SK hynix Inc., Icheon-Si (KR)

(72) Inventor: Ki-Won Nam, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/803,536

(22) Filed: Nov. 3, 2017

(65) Prior Publication Data

US 2018/0226452 A1    Aug. 9, 2018

(30) Foreign Application Priority Data

Feb. 3, 2017    (KR) ........................ 10-2017-0015414

(51) Int. Cl.
| | | |
|---|---|---|
| *G11C 13/00* | (2006.01) | |
| *H01L 27/22* | (2006.01) | |
| *G11C 11/16* | (2006.01) | |
| *H01L 43/12* | (2006.01) | |
| *H01L 43/02* | (2006.01) | |

(52) U.S. Cl.
CPC .......... *H01L 27/228* (2013.01); *G11C 11/165* (2013.01); *H01L 43/02* (2013.01); *H01L 43/12* (2013.01); *G11C 11/161* (2013.01); *G11C 2213/52* (2013.01)

(58) Field of Classification Search
CPC .............. G11C 11/165; G11C 13/0002; G11C 13/0004; G11C 11/161; G11C 2213/52; G11C 13/0021; H01L 27/228; H01L 43/02; H01L 43/12; H01L 43/08; H01L 45/122; H01L 45/1253

USPC .......................................... 365/148, 158, 163
See application file for complete search history.

(56) References Cited

U.S. PATENT DOCUMENTS

| | | | | |
|---|---|---|---|---|
| 8,237,149 | B2 * | 8/2012 | Oh | .......... H01L 45/06 257/296 |
| 8,902,634 | B2 * | 12/2014 | Iwayama | ................ H01L 43/08 257/421 |
| 8,933,430 | B1 * | 1/2015 | Jung | .................... H01L 45/1683 257/4 |
| 9,190,613 | B2 * | 11/2015 | Jung | .................... H01L 45/1683 |
| 9,203,015 | B2 | 12/2015 | Aikawa et al. | |
| 2008/0258128 | A1 * | 10/2008 | Kuh | .................... G11C 13/0004 257/4 |
| 2009/0200640 | A1 * | 8/2009 | Hosoi | .................... H01L 27/101 257/536 |
| 2011/0186798 | A1 * | 8/2011 | Kwon | ...................... H01L 45/06 257/2 |
| 2013/0221309 | A1 * | 8/2013 | Lee | ........................ H01L 45/085 257/2 |

(Continued)

FOREIGN PATENT DOCUMENTS

| | | |
|---|---|---|
| KR | 10-2010-0043470 | 4/2010 |
| KR | 10-2015-0097136 | 8/2015 |

*Primary Examiner* — Tan T. Nguyen
(74) *Attorney, Agent, or Firm* — Perkins Coie LLP

(57) ABSTRACT

An electronic device may include a semiconductor memory, and the semiconductor memory may include a variable resistance element. The variable resistance element may include a lower electrode; a spacer formed on a side surface of the lower electrode; and a variable resistance pattern disposed over the lower electrode, wherein a portion of the lower electrode covers a top surface of the spacer.

20 Claims, 14 Drawing Sheets

(56) References Cited

U.S. PATENT DOCUMENTS

2013/0223124 A1\* 8/2013 Park .................. H01L 27/2436
365/96

\* cited by examiner

ELECTRONIC DEVICE AND METHOD FOR FABRICATING THE SAME

CROSS-REFERENCE TO RELATED APPLICATION

This patent document claims priority of Korean Patent Application No. 10-2017-0015414, entitled "ELECTRONIC DEVICE AND METHOD OF FORMING THE SAME" and filed on Feb. 3, 2017, which is incorporated herein by reference in its entirety.

TECHNICAL FIELD

This patent document relates to memory circuits or devices, methods for fabricating the same and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one aspect, an electronic device may include a semiconductor memory, and the semiconductor memory may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer.

Implementations of the above electronic device may include one or more the following.

The lower electrode may include: a lower portion which is in contact with a side surface of the spacer; and an upper portion which is in continuity with the lower portion, wherein the upper portion may be located over the top surface of the spacer and be in contact with the top surface of the spacer. A side surface of the upper portion may be aligned with a side surface of the variable resistance pattern. The spacer may have an external sidewall that is recessed. The external sidewall may have a portion that be aligned with a side surface of the upper portion and a side surface of the variable resistance pattern. The lower electrode may include: a first lower electrode which is in contact with a side surface of the spacer; and a second lower electrode disposed over the first lower electrode, wherein a portion of the second lower electrode may be in contact with a top surface of the spacer. A thickness of an upper portion of the spacer may be greater than or equal to that of a lower portion of the spacer. The variable resistance pattern may include: a first magnetic layer; a second magnetic layer disposed over the first magnetic layer; a tunnel barrier layer interposed between the first magnetic layer and the second magnetic layer; and an upper electrode disposed over the second magnetic layer, wherein the first magnetic layer includes any one of a free layer or a pinned layer, and the second magnetic layer includes the other one of the free layer and the pinned layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device may include: configuring a substrate; forming a lower plug in an interlayer dielectric layer over the substrate, the lower plug being exposed by a hole in the interlayer dielectric layer; forming a spacer on a sidewall of the hole, wherein a top surface of the spacer is formed at a lower level than a top surface of the interlayer dielectric layer; forming a lower electrode in the hole, wherein a portion of the lower electrode covers the top surface of the spacer; and forming a variable resistance pattern over the lower electrode.

Implementations of the above method for fabricating the electronic device may include one or more the following.

The forming of the lower electrode may include: forming a lower portion of the lower electrode, the lower portion being in contact with a side surface of the spacer; and forming an upper portion of the lower electrode, the upper portion being in continuity with the lower portion, wherein the upper portion may protrude from the top surface of the spacer and be in contact with the top surface of the spacer. A side surface of the upper portion may be aligned with a side surface of the variable resistance pattern. The spacer may have an external sidewall that is recessed. The external sidewall may have a portion that is be aligned with a side surface of the upper portion and a side surface of the variable resistance pattern. The forming of the lower electrode may include: forming a first lower electrode which is in contact with a side surface of the spacer; and forming a second lower electrode disposed over the first lower electrode, wherein a portion of the second lower electrode may be in contact with an top surface of the spacer. A thickness of an upper portion of the spacer may be greater than or equal to that of a lower portion of the spacer. The forming of the variable resistance pattern may include: forming a first magnetic layer; forming a second magnetic layer disposed over the first magnetic layer; forming a tunnel barrier layer interposed between the first magnetic layer and the second magnetic layer; and forming an upper electrode disposed over the second magnetic layer, wherein the first magnetic layer may include any one of a free layer or a pinned layer, and the second magnetic layer includes the other one of the free layer and the pinned layer.

These and other aspects, implementations and associated advantages are described in greater detail in the drawings, the description and the claims.

DETAILED DESCRIPTION

Figure 1:
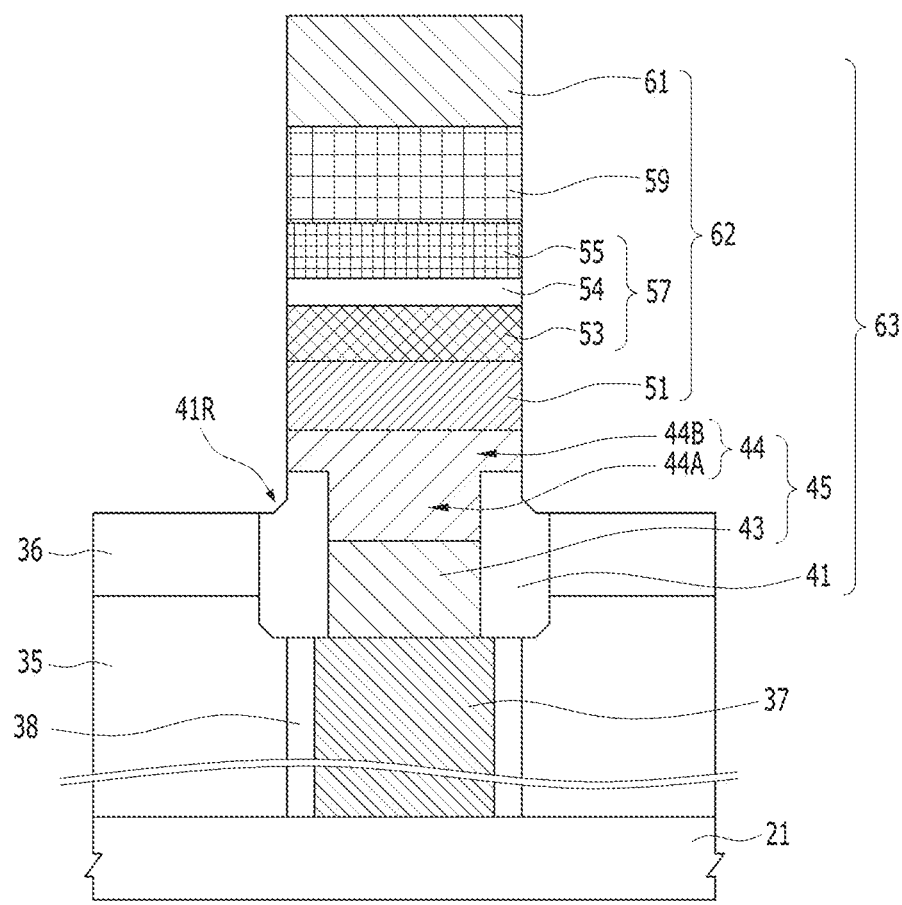
FIGS. 1 to 4 are cross-sectional views illustrating an exemplary semiconductor device including a variable resistance element in accordance with an implementation of the present disclosure.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers may be present between two illustrated layers). As a specific example, when a first layer in a described or illustrated multi-layer substrate is referred to as being "on" or "over" a second layer or "on" or "over" a substrate, the first layer may be directly formed on the second layer or the substrate but may also represent a substrate where one or more other intermediate layers may exist between the first layer and the second layer or the substrate.

An electronic device in accordance with implementations of the present disclosure may include a semiconductor memory or a semiconductor device which includes a variable resistance element that exhibits different resistance values or states for storing different digital data and can be switched between different resistance states in response to an applied bias (for example, a current or voltage). Variable resistance elements can be used as memory cells and may be arranged in various way to form a semiconductor memory. In an implementation, the variable resistance element may include a lower electrode, an MTJ (Magnetic Tunnel Junction) structure and an upper electrode. The semiconductor memory or the semiconductor device may include an STT-RAM (Spin Transfer Torque Random Access Memory) or an MRAM (Magnetic Random Access Memory).

In implementations where a variable resistance element is implemented to include an MTJ structure, such an MTJ structure can include a free layer having a variable magnetization direction (e.g., the layer 55 in the MTJ 57 in FIG. 1 and other figures), a pinned layer having a fixed magnetization direction (e.g., the layer 53 in the MTJ 57 in FIG. 1 and other figures), and a tunnel barrier layer interposed between the free layer and the pinned layer (e.g., the layer 54 in the MTJ 57 in FIG. 1 and other figures). The free layer may have a variable magnetization direction that causes the MTJ structure to have a variable resistance value. A change of relative magnetization directions of the free layer and the pinned layer causes the MTJ structure to exhibit different resistance states that can be used to store or represent different data bits. The free layer may also be referred as a storage layer. In some implementations, the magnetization direction of the free layer may be substantially perpendicular to a surface of the free layer, the tunnel barrier layer and the pinned layer.

The lower electrode and the MTJ structure may include a plurality of metallic compound layers. The processes for patterning the plurality of metallic compound layers may face a variety of difficulties. For example, conductive by-products resulting from the etching processes may be re-deposited on sides of the MTJ to cause defects. For example, problems such as an increase in a WER0 (write error rate) or a shunt failure may occur. In recognition of the problems, a new technology is needed to improve characteristics and processes of the variable resistance element including the lower electrode and the MTJ structure.

FIGS. 1 to 4 are cross-sectional views illustrating a semiconductor device including a variable resistance element in accordance with an implementation of the present disclosure.

Referring to FIG. 1, a semiconductor device including a variable resistance element in accordance with the implementation of the present disclosure may include a first interlayer dielectric layer 35 formed over a substrate 21, a second interlayer dielectric layer 36, a lower plug 37, a lower spacer 38, an upper spacer 41, a lower electrode 45, a first auxiliary layer 51, a first magnetic layer 53, a tunnel barrier layer 54, a second magnetic layer 55, a second auxiliary layer 59 and an upper electrode 61. The lower electrode 45 may include a first lower electrode 43 and a second lower electrode 44. The second lower electrode 44 may include a lower portion 44A and an upper portion 44B.

The first magnetic layer 53, the tunnel barrier layer 54 and the second magnetic layer 55 may form an MTJ structure 57. The first auxiliary layer 51, the MTJ structure 57, the second auxiliary layer 59 and the upper electrode 61 may form a variable resistance pattern 62. The upper spacer 41, the lower electrode 45 and the variable resistance pattern 62 may form a variable resistance element 63.

The lower spacer 38 may surround side surfaces of the lower plug 37. The lower plug 37 may be confined within the lower spacer 38. The upper spacer 41 may be formed over the lower spacer 38. The upper spacer 41 may cover the lower spacer 38. The upper spacer 41 may have a width greater than that of the lower spacer 38. The upper spacer 41 may have inner walls that are located over the lower plug 37 and external walls that extend into the first interlayer dielectric layer 35. A bottom surface of the upper spacer 41 may be in contact with the lower spacer 38 and the lower plug 37.

Side surfaces of the first lower electrode 43 may be surrounded by the upper spacer 41. The first lower electrode 43 may be confined by the upper spacer 41. The first lower electrode 43 may be in contact with the lower plug 37. An upper surface of the first lower electrode 43 may be formed at a lower level than an upper surface of the upper spacer 41. In an implementation, a horizontal width of the first lower electrode 43 may be narrower than a that of the lower plug 37.

The second lower electrode 44 may be in direct contact with the first lower electrode 43. The upper portion 44B of the second lower electrode 44 may be in continuity with the lower portion 44A. The lower portion 44A and the upper portion 44B may include a physically and chemically identical material with each other. The lower portion 44A of the second lower electrode 44 may be in contact with the first lower electrode 43. The upper portion 44B of the second lower electrode 44 has a structure symmetric with respect to the center of the device. Side surfaces of the lower portion 44A may be surrounded by the upper spacer 41. The lower portion 44A may be confined by the upper spacer 41. The upper portion 44B of the second lower electrode 44 may cover the upper spacer 41. The upper portion 44B of the second lower electrode 44 may have a greater width than that of the lower portion 44A of the second lower electrode 44.

The first lower electrode 43 may be self-aligned with the lower plug 37. The first lower electrode 43 has a structure symmetric with respect to a center of the device. A center of the first lower electrode 43 may be vertically aligned with a center of the lower plug 37. The width of the first lower electrode 43 may be smaller than that of the lower plug 37, which makes the upper spacer 41 formed on sides of the lower plug is located over the lower plug 37. Side surfaces of the upper portion 44B of the second lower electrode 44 may be aligned with side surfaces of the variable resistance pattern 62. The upper spacer 41 may include a recess region 41R formed on an outside of the second lower electrode 44. With the recess region 41R, the upper spacer 41 is recessed around at a corner of the upper spacer 41. For example, the spacer 41 may have an external sidewall that is recessed. The recess region 41R may be aligned with the outside of the upper portion 44B of the second lower electrode 44. Side-walls of the recess region 41R may be aligned with side surfaces of the upper portion 44B and side surfaces of the variable resistance pattern 62. The recess region 41R forms a boundary of the upper spacer 41 connecting the sidewalls of the upper portion 44B of the second lower electrode 44 and the top surface of the second interlayer dielectric layer 36.

The first auxiliary layer 51 may be formed over the second lower electrode 44. The first auxiliary layer 51 may include an under layer, a seed layer, a spacer layer, a magnetic correction layer, a shift cancelling layer, or an etch stop layer, or a combination thereof. For example, the first auxiliary layer 51 may include the under layer. The first magnetic layer 53 may be formed over the first auxiliary layer 51. The first magnetic layer 53 may include a free layer or a pinned layer. Hereinafter, for the sake of simplicity, it is assumed that the first magnetic layer 53 includes the free layer. The first magnetic layer 53 may operate as a storage layer.

The tunnel barrier layer may be formed over the first magnetic layer 53. The second magnetic layer 55 may be formed over the tunnel barrier layer and cover the tunnel barrier layer 54. The second magnetic layer 55 may include any one of the free layer and the pinned layer, which is different from the layer included in the first magnetic layer 53. Hereinafter, for the sake of simplicity, it is assumed that the first magnetic layer 53 includes the free layer and the second magnetic layer 55 includes the pinned layer. The tunnel barrier layer 54 may be interposed between the first magnetic layer 53 and the second magnetic layer 55. The second magnetic layer 55 may operate as a reference layer. The second auxiliary layer 59 may be formed over the second magnetic layer 55 and cover the second magnetic layer 55. The second auxiliary layer 59 may include an electrode layer, a seed layer, a spacer layer, a magnetic correction layer, a shift cancelling layer, an etch stop layer, or a capping layer, or a combination thereof. The second auxiliary layer 59 may include a layer which is different from the layer included in the first auxiliary layer 51. In an implementation, the second auxiliary layer 59 may include the shift cancelling layer and the capping layer formed over the shift cancelling layer. An upper electrode 61 may be formed over the second auxiliary layer 59.

Figure 2:
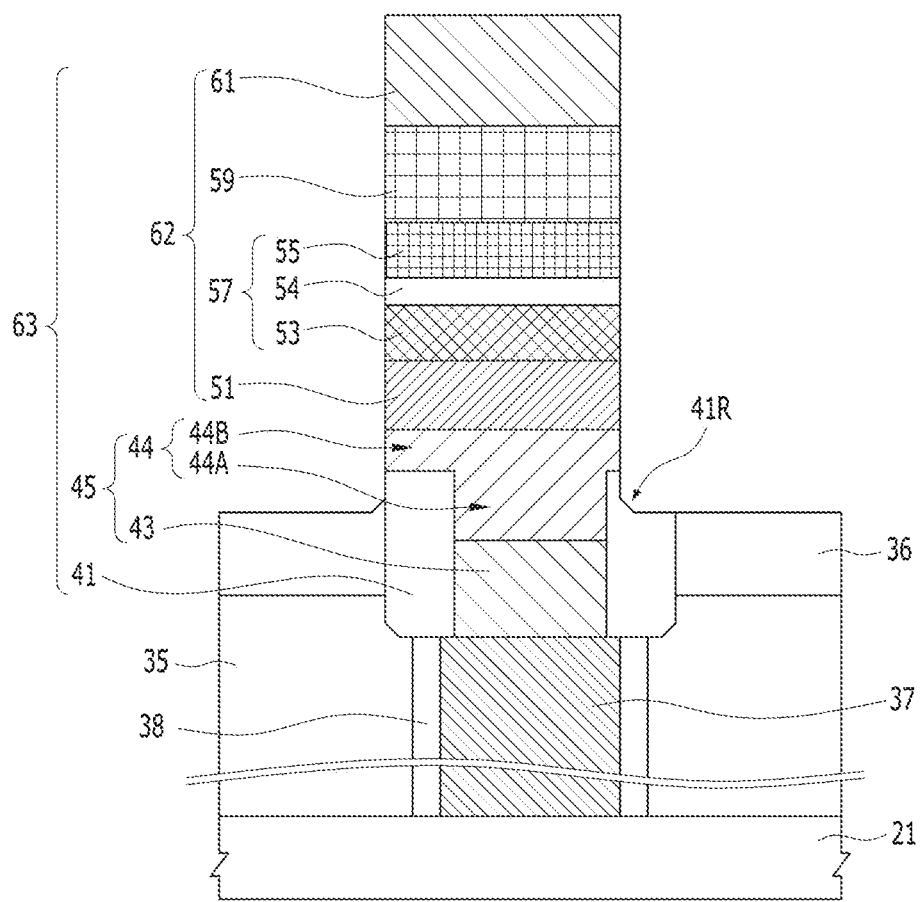

FIG. 2 shows a cross-sectional view of an exemplary semiconductor device. Referring to FIG. 2, the variable resistance pattern 62 may have a different structure than that of FIG. 1 due to an alignment error caused during a photolithography or a patterning process. In FIG. 2, side surfaces of the upper portion 44B may be aligned with side surfaces of the variable resistance pattern 62. The upper portion 44B of the second lower electrode 44 has a structure asymmetric with reference to a center of the device. The upper spacer 41 has two asymmetric portions on sides of the lower portion 44A of the second lower electrode 44 and the first lower electrode 43. The upper spacer 41 may include a recess region 41R formed on an outside of the upper portion 44B of the second lower electrode 44. The recess region 41 forms a boundary of the upper spacer 41 connecting the sidewall of the upper portion 44B of the second lower electrode 44 and the top surface of the second interlayer dielectric layer 36. The recess region 41R may be formed locally in an upper region of the upper spacer 41. A sidewall of the recess region 41R may be aligned with side surfaces of the upper portion 44B and the side surfaces of the variable resistance pattern 62.

Figure 3:
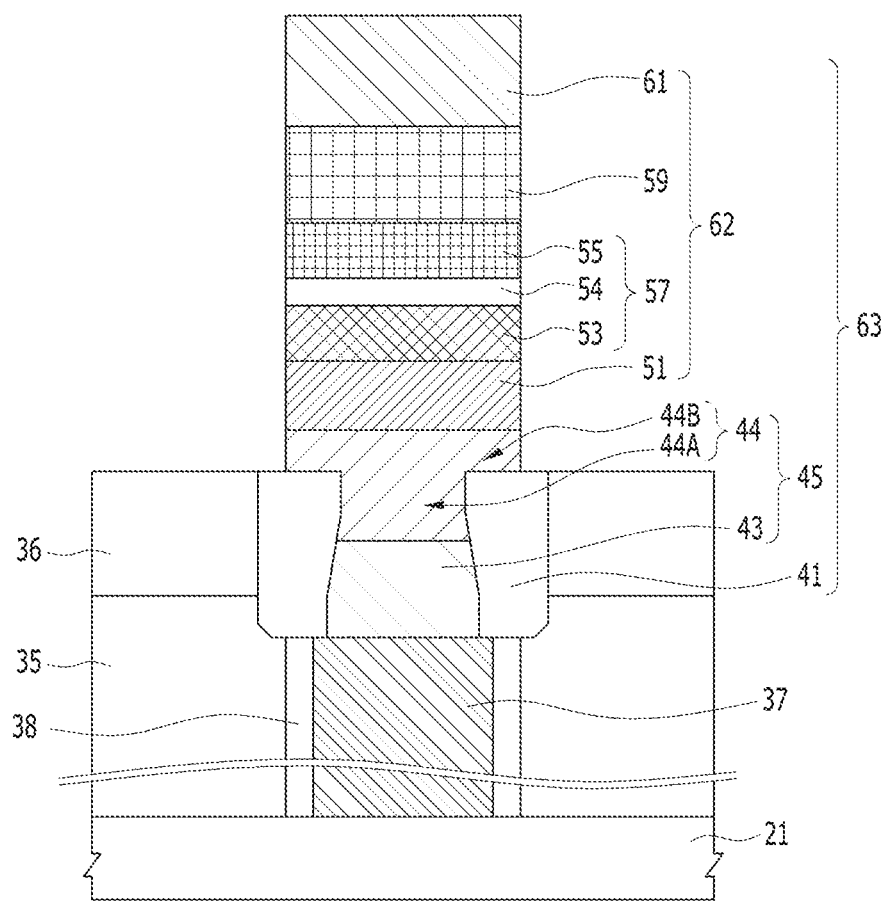

FIG. 3 shows a cross-sectional view of an exemplary semiconductor device. Referring to FIG. 3, the upper spacer 41 may have an upper region which is thicker than a lower region. The lower portion 44A of the second lower electrode 44 may have a smaller horizontal width than that of the first lower electrode 43. The sidewall of the upper spacer 41 may be curved.

Figure 4:
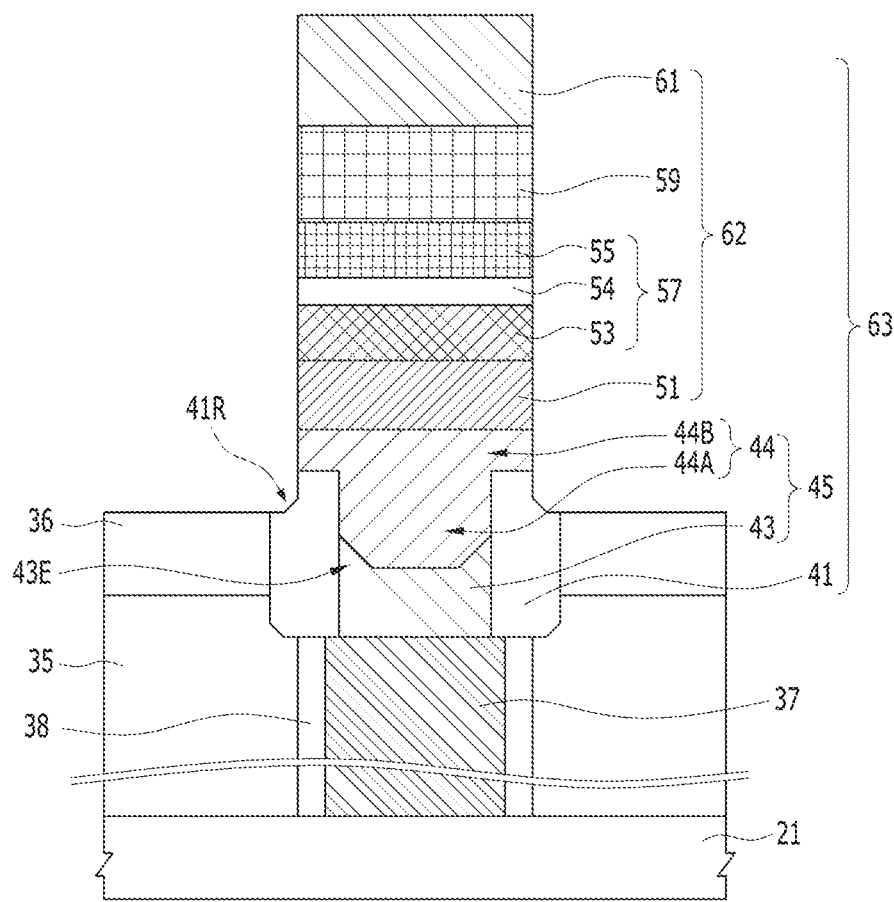

FIG. 4 shows a cross-sectional view of an exemplary semiconductor device. Referring to FIG. 4, the first lower electrode 43 may include a protrusion part 43E protruding toward the first lower electrode 43. A top surface of the first lower electrode 43 may have a shape that is recessed toward a center portion. The center portion of the first lower electrode 43 is lower than the side portions of the first lower electrode 43.

FIGS. 5 to 12 are cross-sectional views illustrating an example of a method for fabricating a semiconductor device including a variable resistance element and a related electronic device in accordance with an implementation of the present disclosure.

Figure 5:
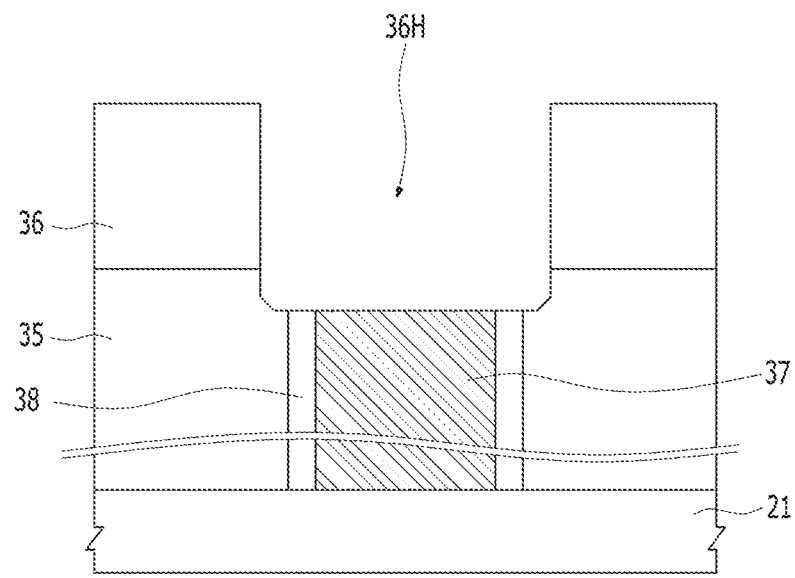
FIGS. 5 to 12 are cross-sectional views illustrating an example of a method for fabricating a semiconductor device including a variable resistance element in accordance with an implementation of the present disclosure.

Referring to FIG. 5, a first interlayer dielectric layer 35 may be formed over a substrate 21. A second interlayer dielectric layer 36 may be formed over the first interlayer dielectric layer 35. A lower plug 37 and a lower spacer 38 may be formed in the first interlayer dielectric layer 35. A hole 36H passing through the second interlayer dielectric layer 36 and exposing the lower plug 37 may be formed.

The lower spacer 38 may surround the lower plug 37. The lower spacer 38 may be interposed between the first interlayer dielectric layer 35 and the lower plug 37. The lower spacer 38 may include a dielectric material such as silicon oxide, silicon nitride, or silicon oxynitride, or a combination thereof. The lower spacer 38 may surround side surfaces of the lower plug 37. The lower plug 37 may be confined within the lower spacer 38. The lower plug 37 may include a conductive material such as polysilicon, a metal, a metal nitride, a metal oxide, a metal silicide, or conductive carbon, or a combination thereof. For example, the lower plug 37 may include TiN. The first interlayer dielectric layer 35 and the second interlayer dielectric layer 36 may include a dielectric material such as silicon oxide, silicon nitride, silicon oxynitride, or low-K dielectrics, or a combination thereof. In an implementation, the second interlayer dielectric layer 36 may include a material which has a etch selectivity to the first interlayer dielectric layer 35 and the lower spacer 38.

A process for forming the hole 36H may include recessing the lower plug 37 and the lower spacer 38. The hole 36H may be self-aligned with the lower plug 37. A center of the hole 36H may be vertically aligned with a center of the lower plug 37. The hole 36H may have a greater width than that of the lower plug 37. A bottom of the hole 36H may be formed at a lower level than a top surface of the first interlayer dielectric layer 35. The lower plug 37 and the lower spacer 38 may be exposed through the hole 36H.

While FIG. 5 shows that top surfaces of the lower spacer 38 and the lower plug 37 have a top surface located at a substantially same level as a top surface of the lower plug, other implementations are also possible. For example, a top surface of the lower spacer 38 may be positioned at a higher level than the lower plug 37 or at a lower level than the lower plug 37. For the sake of simplicity, it will be assumed that the top surface of the lower spacer 38 is formed at the substantially same level as the top surface of the lower plug 37. In FIG. 5, it is shown for the sake of simplicity that the top surface of the lower plug 37 is flat. However, the lower plug 37 may have a shape that its center portion is recessed at a lower level than its side portions or a shape that its center portion protrudes at a higher level than its side portions.

In an implementation, the process for forming the hole 36H may include a patterning process.

Figure 6:
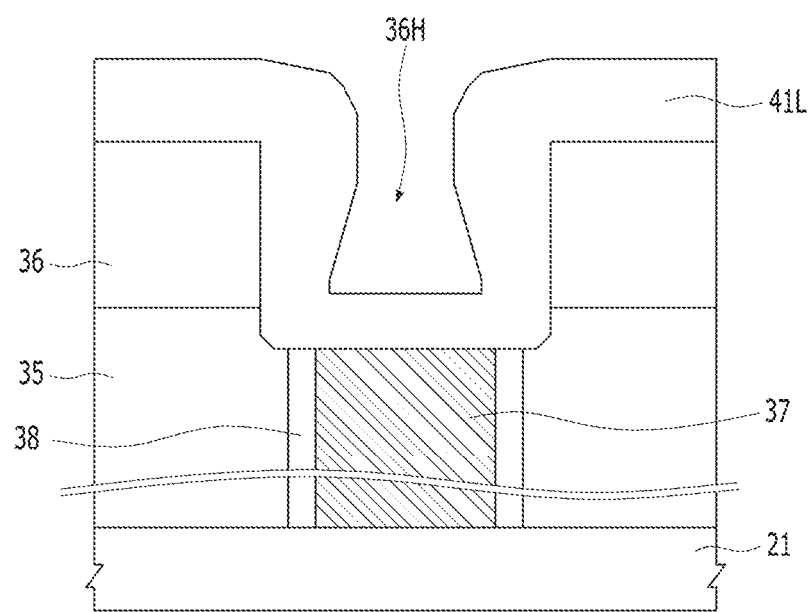

Referring to FIG. 6, a spacer layer 41L covering walls of the hole 36H and the second interlayer dielectric layer 36 may be formed. On the sidewalls of the hole 36H, an upper portion of the spacer layer 41L may protrudes in a horizontal direction as compared to a lower portion of the spacer layer 41L. The spacer layer 41L may have an overhanging shape. The spacer layer 41L may include a material having an etch selectivity to the second interlayer dielectric layer 36. The spacer layer 41L may include a dielectric material such as silicon oxide, silicon nitride, or silicon oxynitride, or a combination thereof. For example, the spacer layer 41L may include a material with poor step coverage and low electrical conductivity. In an implementation, the spacer layer 41L may include a material having a carbon functional group. The spacer layer 41L may include amorphous carbon. In an implementation, the spacer layer 41L may include an oxide such as a USG (undoped silica glass).

Figure 7:
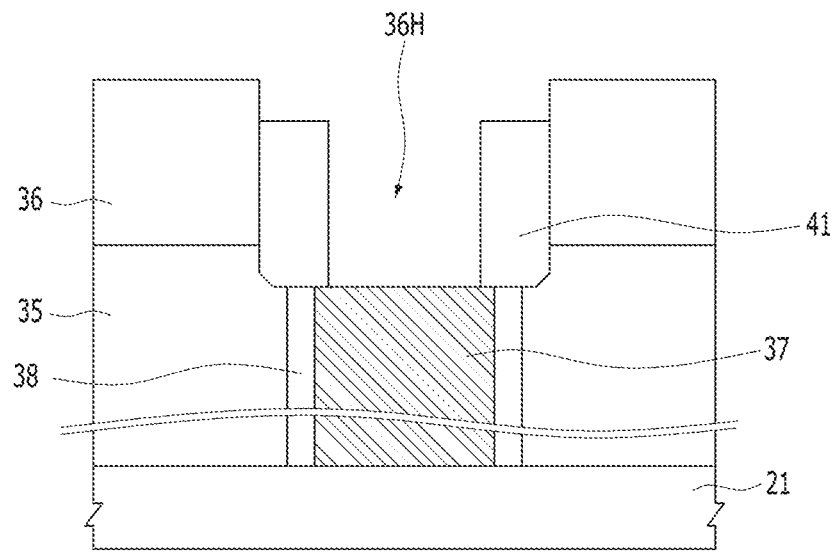

Referring to FIG. 7, an upper spacer 41 may be formed by partially removing the spacer layer 41L. The process for forming the upper spacer 41 may include an anisotropic etching process, or an isotropic etching process, or a combination thereof.

The upper spacer 41 may be formed on the sidewalls of the hole 36H. The upper spacer 41 may be located over the lower spacer 38 and the lower plug 37. The upper spacer 41 may cover the lower spacer 38. The upper spacer 41 may be thicker than the lower spacer 38. A bottom surface of the upper spacer 41 may be in contact with the lower spacer 38 and the lower plug 37. A top surface of the upper spacer 41 may be formed at a lower level than a top surface of the second interlayer dielectric layer 36. After the upper spacer 41 is arranged on the sidewalls of the hole 36H, the lower plug 37 may be still exposed. Since the upper spacer 41 has the top surface lower than that of the second interlayer dielectric layer 36, portions of the sidewalls of the hole 36H may be exposed over the upper spacer 41.

Figure 8:
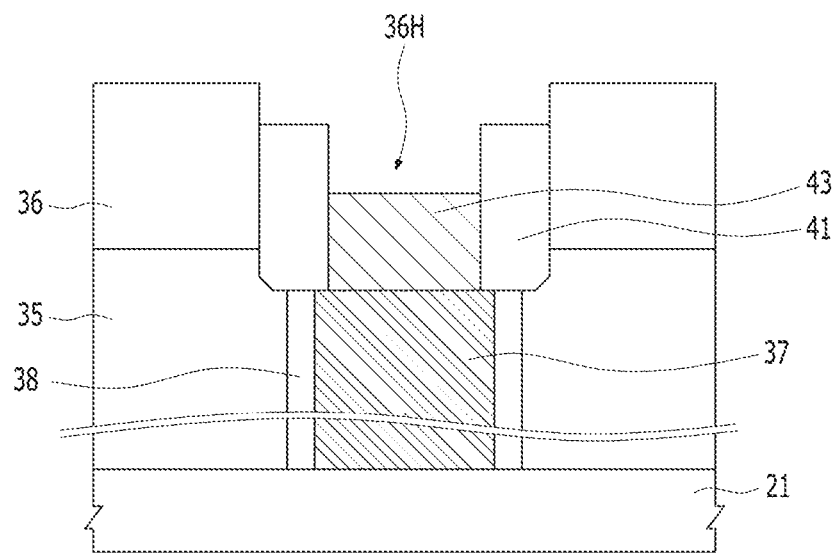

Referring to FIG. 8, a first lower electrode 43 may be formed in the hole 36H. The process for forming the first lower electrode 43 may include a thin film forming process and an etch-back process. The first lower electrode 43 may include a conductive material such as a metal, a metal nitride, a metal oxide, a metal silicide, or conductive carbon, or a combination thereof. For example, the first lower electrode 43 may include TiN. The first lower electrode 43 may be in contact with the lower plug 37. A top surface of the first lower electrode 43 may be formed at a lower level than a top surface of the upper spacer 41. Side surfaces of the first lower electrode 43 may be surrounded by the upper spacer 41. The first lower electrode 43 may be confined by the upper spacer 41.

In an implementation, a horizontal width of the first lower electrode 43 may be narrower than a top surface of the lower plug 37. FIG. 6 shows that the top surface of the first lower electrode 43 is flat. However, other implementations are also possible. For example, the top surface of the first lower electrode 43 may have a shape that is recessed at its center portion such that the center portion is at a lower level or a shape that protrudes at its center portion such that the center portion is at a higher level.

Figure 9:
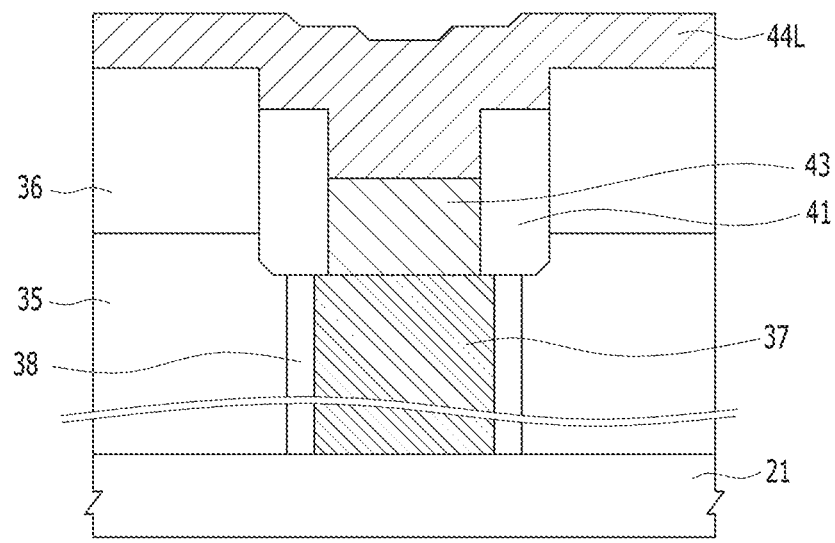

Referring to FIG. 9, a second lower electrode layer 44L filling the hole 36H and covering the second interlayer dielectric layer 36 may be formed. The second lower electrode layer 44L may include a conductive material such as a metal, a metal nitride, a metal oxide, a metal silicide, or conductive carbon, or a combination thereof. The second lower electrode layer 44L may be in direct contact with the first lower electrode 43. The first lower electrode 43 may include a material having a good gap-fill characteristic as compared to the second lower electrode layer 44L. For example, the first lower electrode 43 may include TiN, and the second lower electrode layer 44L may include Ta.

In an implementation, the first lower electrode 43 may be omitted. In this case, the second lower electrode layer 44L may be in direct contact with the lower plug 37.

Figure 10:
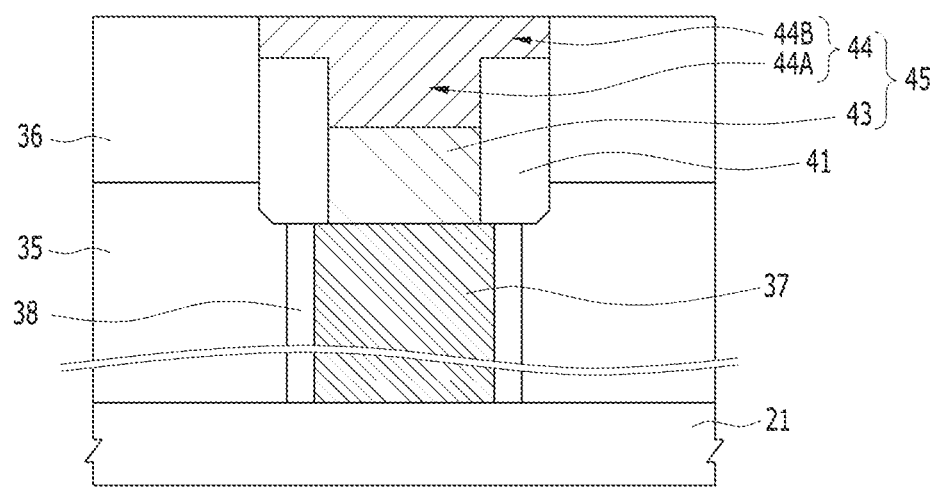

Referring to FIG. 10, a second lower electrode 44 may be formed by planarizing the second lower electrode layer 44L until the second interlayer dielectric layer 36 is exposed. The second lower electrode 44 may include a lower portion 44A and an upper portion 44B. The first lower electrode 43 and the second lower electrode 44 may form a lower electrode 45. The upper portion 44B of the second lower electrode 44 may be in continuity with the lower portion 44A. The lower portion 44A and the upper portion 44B may include a physically and chemically identical material with each other.

The lower portion 44A of the second lower electrode 44 may be in contact with the first lower electrode 43. Side surfaces of the lower portion 44A may be surrounded by the upper spacer 41. The lower portion 44A may be confined by the upper spacer 41. The upper portion 44B of the second lower electrode 44 may cover the upper spacer 41.

The process for planarizing the second lower electrode layer 44L may include a chemical mechanical polishing (CMP) process, or an etch-back process, or a combination thereof. In accordance with the implementations, the upper spacer 41 may be covered by the upper portion 44B of the second lower electrode 44. An upper surface of the upper portion 44B and an upper surface of the second interlayer dielectric layer 36 may be more flat as compared to the case where the upper spacer 41 is exposed. The upper surface of the upper portion 44B and the upper surface of the second interlayer dielectric layer 36 may be exposed in the substantially same plane as each other.

Figure 11:
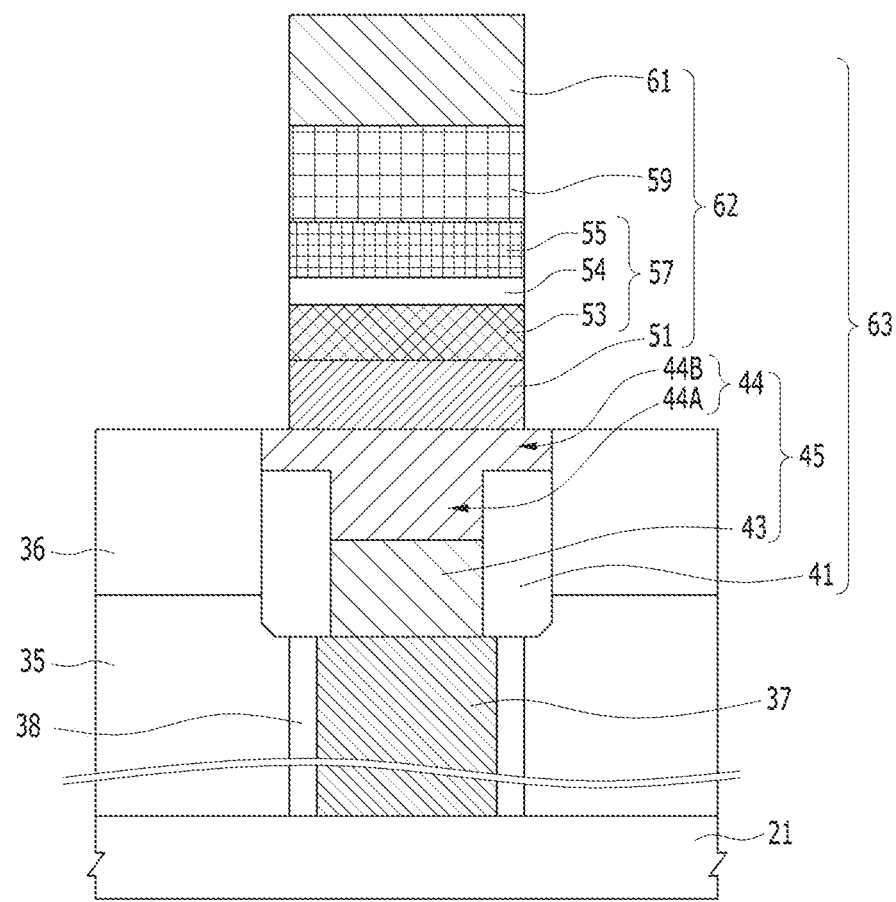

Referring to FIG. 11, a variable resistance pattern 62 may be formed over the second lower electrode 44. The variable resistance pattern 62 may include a first auxiliary layer 51, a first magnetic layer 53, a tunnel barrier layer 54, a second magnetic layer 55, a second auxiliary layer 59, and an upper electrode 61. The first magnetic layer 53, the tunnel barrier layer 54, and the second magnetic layer 55 may form an MTJ structure 57. The upper spacer 41, the lower electrode 45, and the variable resistance pattern 62 may form a variable resistance element 63.

The first auxiliary layer 51 may be formed over the second lower electrode 44. The first auxiliary layer 51 may include an under layer, a seed layer, a spacer layer, a magnetic correction layer, a shift cancelling layer, or an etch stop layer, or a combination thereof. For example, the first auxiliary layer 51 may include the under layer. In an implementation, the first auxiliary layer 51 may include an AlN layer.

The first magnetic layer 53 may be formed over the first auxiliary layer 51. The first magnetic layer 53 may include a free layer or a pinned layer. Hereinafter, for the sake of simplicity, it will be explained assuming that the first magnetic layer 53 includes the free layer. The first magnetic layer 53 may correspond to a storage layer (SL). In an implementation, the free layer may include an SAF (synthetic antiferromagnet) structure. The first magnetic layer 53 may include a single-layer or multilayer structure including a ferromagnetic material. For example, the first magnetic layer 53 may include an alloy based on Fe, Ni or Co. The first magnetic layer 53 may include an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or a combination thereof. The first magnetic layer 53 may include a stack of metals, such as Co/Pt, or Co/Pd or the like. In an implementation, the first magnetic layer 53 may include a Co—Fe—B alloy.

In an implementation, the first magnetic layer 53 may be formed over the first auxiliary layer 51. The first magnetic layer 53 may cover the first auxiliary layer 51. One surface of the first magnetic layer 53 may be in direct contact with the first auxiliary layer 51. In an implementation, the first auxiliary layer 51 and the first magnetic layer 53 may be alternately and repeatedly stacked.

The tunnel barrier layer 54 may cover the first magnetic layer 53. One surface of the tunnel barrier layer 54 may be in direct contact with the first magnetic layer 53. The tunnel barrier layer 54 may include an oxide such as MgO, CaO, SrO, TiO, VO, or NbO, or a combination thereof. In an implementation, the tunnel barrier layer 54 may include MgO.

The second magnetic layer 55 may cover the tunnel barrier layer 54. One surface of the second magnetic layer 55 may be in direct contact with the tunnel barrier layer 54. The second magnetic layer 55 may include any one of the free layer and the pinned layer, which is different from the first magnetic layer 53. Hereinafter, for the sake of simplicity, it will be explained assuming that the first magnetic layer 53 includes the free layer and the second magnetic layer 55 includes the pinned layer. The tunnel barrier layer 54 may be disposed between the first magnetic layer 53 and the second magnetic layer 55.

The second magnetic layer 55 may correspond to a reference layer. In an implementation, the pinned layer may include an SAF (synthetic antiferromagnet) structure. The second magnetic layer 55 may include a single-layer or multilayer structure including a ferromagnetic material. For example, the second magnetic layer 55 may include an alloy based on Fe, Ni or Co. The second magnetic layer 55 may include an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or a combination thereof. The second magnetic layer 55 may include a stack of metals, such as Co/Pt, or Co/Pd or the like. In an implementation, the second magnetic layer 55 may include Co—Fe—B alloy.

The second auxiliary layer 59 may cover the second magnetic layer 55. One surface of the second auxiliary layer 59 may be in direct contact with the second magnetic layer 55. The second auxiliary layer 59 may include an electrode layer, a seed layer, a spacer layer, a magnetic correction layer, a shift cancelling layer, an etch stop layer, or a capping layer, or a combination thereof. The second auxiliary layer 59 may include a different layer from that included in the first auxiliary layer 51. In an implementation, the second auxiliary layer 59 may include the shift cancelling layer and the capping layer formed over the shift cancelling layer. The shift cancelling layer may have a magnetization direction anti-parallel to the magnetization direction of the pinned layer in order to offset or reduce the effect of a stray magnetic field produced by the pinned layer. The shift cancelling layer may serve to alleviate the generation of a biased magnetic field due to the effect of the stray magnetic field produced by the pinned layer. The shift cancelling layer may include CoPt, CoPd, FePt, or FePd, or a combination thereof. In an implementation, the shift cancelling layer may include a CoPt layer. The capping layer may include a metal layer such as Ru.

In an implementation, the second magnetic layer 55 and the second auxiliary layer 59 may be alternately and repeatedly stacked.

The upper electrode 61 may be formed over the second auxiliary layer 59. The upper electrode 61 may function as a hard mask. The upper electrode 61 may include a metal layer such as W.

The process for forming the variable resistance pattern 62 may include a plurality of thin films forming processes and a patterning process. Side surfaces of the variable resistance pattern 62 may be aligned with side surfaces of the upper electrode 61. An upper surface of the second lower electrode 44 and an upper surface of the second interlayer dielectric layer 36 may be exposed on an outside of the variable resistance pattern 62.

Figure 12:
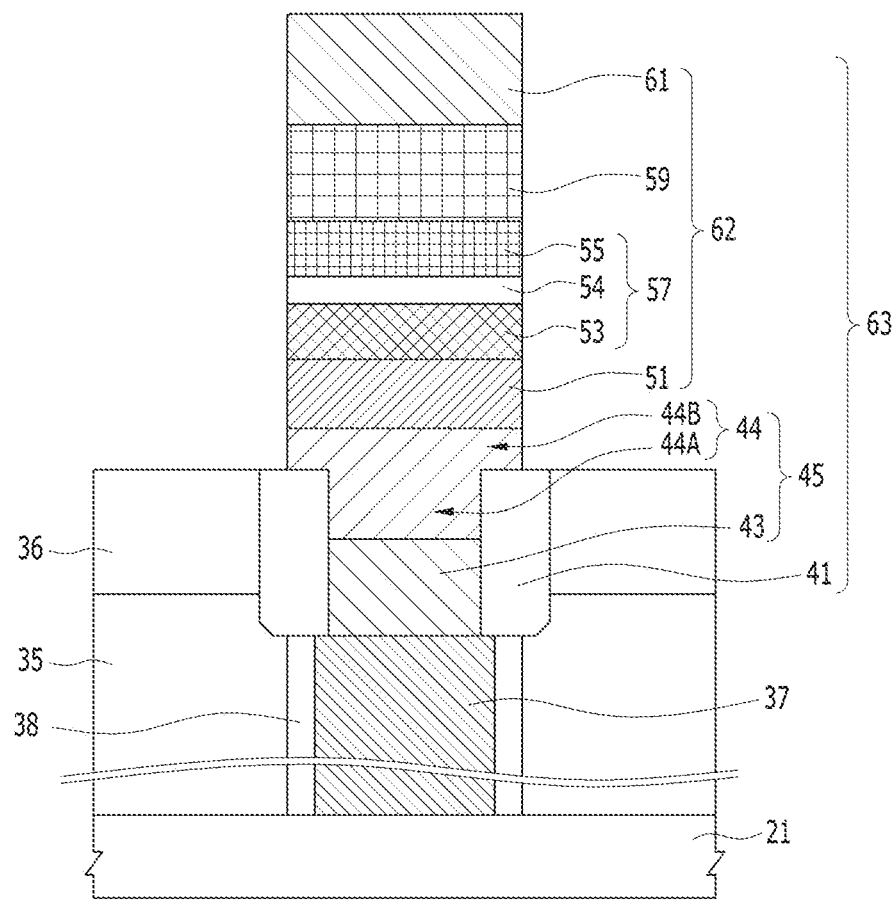

Referring to FIG. 12, the upper spacer 41 may be exposed by partially removing the lower electrode 45.

The upper portion 44B of the second lower electrode 44 may be partially removed by using an anisotropic etching process to expose the upper spacer 41. Side surfaces of the upper portion 44B may be aligned with side surfaces of the variable resistance pattern 62. During partially removing the upper portion 44B, the second interlayer dielectric layer 36 may be also partially removed to be recessed downwardly. The partial removal of the second interlayer dielectric layer 36 makes a top surface of the second interlayer dielectric layer 36 be located at the same level as the top surface of the upper spacer 41.

Referring back to FIG. 1, the upper spacer 41 may be partially removed by using an anisotropic etching process to form a recess region 41R. During partially removing the upper spacer 41, the second interlayer dielectric layer 36 may be also partially removed to be recessed downwardly. The recess region 41R may be formed along a boundary line of the upper spacer 41, which connects the sidewall of the upper portion 44B and the top surface of the second interlayer dielectric layer 36. The recess region 41R may be aligned with an outside of the upper portion 44B of the second lower electrode 44. Sidewalls of the recess region 41R may be aligned with the side surfaces of the upper portion 44B and the side surfaces of the variable resistance pattern 62.

In accordance with the implementations, even though a metallic material is attached to side surfaces of the variable resistance pattern 62 during partially removing the upper portion 44B of the second lower electrode 44 in the etching process, the metallic material attached to the side surfaces of the variable resistance pattern 62 can be effectively removed by the partial removal of the upper spacer 41. Thus, It is possible to effectively and remarkably reduce contamination on the side surfaces of the variable resistance pattern 62. Characteristics of the variable resistance element 63 can be significantly improved and production efficiency of the semiconductor device including the variable resistance element 63 can be maximized.

Figure 13:
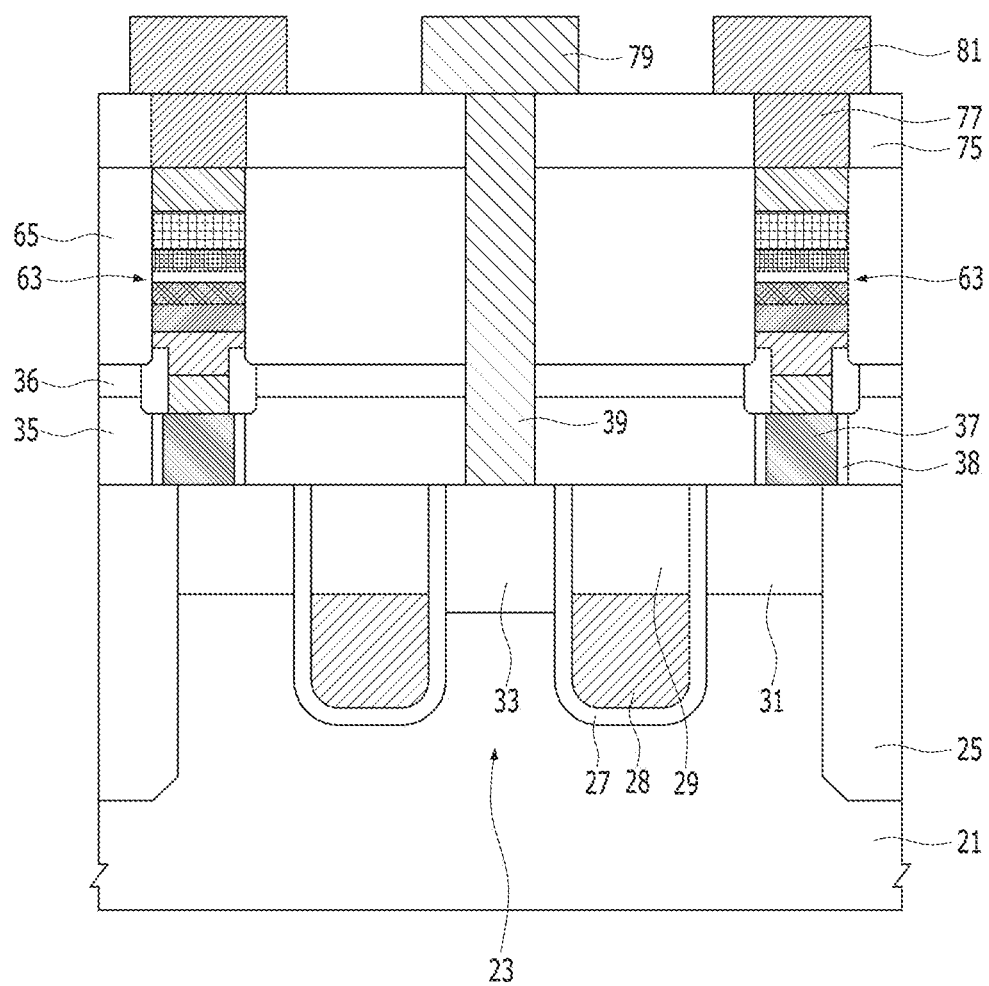
FIG. 13 is a cross-sectional view illustrating a semiconductor device including a variable resistance element in accordance with an implementation of the present disclosure.

FIG. 13 is a cross-sectional view illustrating a semiconductor device including a variable resistance element and a related electronic device in accordance with an implementation of the present disclosure.

Referring to FIG. 13, a semiconductor device in accordance with the implementation of the present disclosure may include a substrate 21, an active region 23, a device isolation layer 25, a gate dielectric layer 27, a gate electrode 28, a gate capping layer 29, a drain region 31, a source region 33, a first interlayer dielectric layer 35, a second interlayer dielectric layer 36, a lower plug 37, a lower spacer 38, a source plug 39, a variable resistance element 63, a third interlayer dielectric layer 65, a fourth interlayer dielectric layer 75, an upper plug 77, a source line 79, and a bit line 81.

The device isolation layer 25 including the active region 23 may be formed over the substrate 21. The substrate 21 may be a semiconductor substrate such as a silicon wafer or an SOI (silicon on insulator) wafer. The device isolation layer 25 may be formed by using an STI (shallow trench isolation) method. The device isolation layer 25 may include a dielectric material such as silicon oxide, silicon nitride, or silicon oxynitride, or a combination thereof.

The gate dielectric layer 27, the gate electrode 28, the gate capping layer 29, the drain region 31, and the source region 33 may be formed in the active region 23. A top surface of the gate electrode 28 may be formed at a lower level than a top surface of the drain region 31 and a top surface of the source region 33. The gate capping layer 29 may cover the gate electrode 28. The active region 23, the gate dielectric layer 27, the gate electrode 28, the drain region 31, and the source region 33 may form a recess channel transistor. The recess channel transistor may function as a switching element.

In an implementation, the switching element may include a 3-dimensional transistor, a vertical transistor, a finFET, a nanowire transistor, a planar transistor, or a diode, or a combination thereof instead of the recess channel transistor.

The gate dielectric layer 27 may include a dielectric material such as silicon oxide, silicon nitride, silicon oxynitride, or high-K dielectrics, or a combination thereof. The gate electrode 28 may include a conductive material such as polysilicon, a metal, a metal nitride, a metal oxide, a metal silicide, or conductive carbon, or a combination thereof. The gate capping layer 29 may include a dielectric material such as silicon oxide, silicon nitride, or silicon oxynitride, or a combination thereof. The drain region 31 and the source region 33 may be formed by implanting impurities into the active region 23. For example, the active region 23 may include a p-type impurity, and the drain region 31 and the source region 33 may include an n-type impurity.

The first interlayer dielectric layer 35, the second interlayer dielectric layer 36, the third interlayer dielectric layer 65, and the fourth interlayer dielectric layer 75 may be sequentially stacked over the substrate 21 including the recess channel transistor and the device isolation layer 25. The first interlayer dielectric layer 35, the second interlayer dielectric layer 36, the third interlayer dielectric layer 65, and the fourth interlayer dielectric layer 75 may include a dielectric material such as silicon oxide, silicon nitride, silicon oxynitride, or low-K dielectrics, or a combination thereof.

The lower plug 37 may pass through the first interlayer dielectric layer 35 to be coupled to the drain region 31. The lower spacer 38 may surround side surfaces of the lower plug 37. The variable resistance element 63 may be formed over the lower plug 37. The variable resistance element 63 may be formed similarly to the method described with reference to FIGS. 1 to 13. The upper plug 77 passing through the fourth interlayer dielectric layer 75 and coupled to the variable resistance element 63 may be formed. The upper plug 77 may include a conductive material such as polysilicon, a metal, a metal nitride, a metal oxide, a metal silicide, or conductive carbon, or a combination thereof.

The source plug 39 passing through the fourth interlayer dielectric layer 75, the third interlayer dielectric layer 65, the second interlayer dielectric layer 36 and the first interlayer dielectric layer 35 and coupled to the source region 33 may be formed. The source plug 39 may include a conductive material such as polysilicon, a metal, a metal nitride, a metal oxide, a metal silicide, or conductive carbon, or a combination thereof. The source line 79 coupled to the source plug 39 may be formed over the fourth interlayer dielectric layer 75. The bit line 81 coupled to the upper plug 77 may be formed over the fourth interlayer dielectric layer 75. The source line 79 and the bit line 81 may include a conductive material such as a metal, a metal nitride, a metal oxide, a metal silicide, or conductive carbon, or a combination thereof.

The above and other memory circuits or semiconductor devices based on the disclosed technology can be used in a range of devices or systems. FIGS. 14 to 18 provide some examples of devices or systems that can implement the memory circuits disclosed herein.

Figure 14:
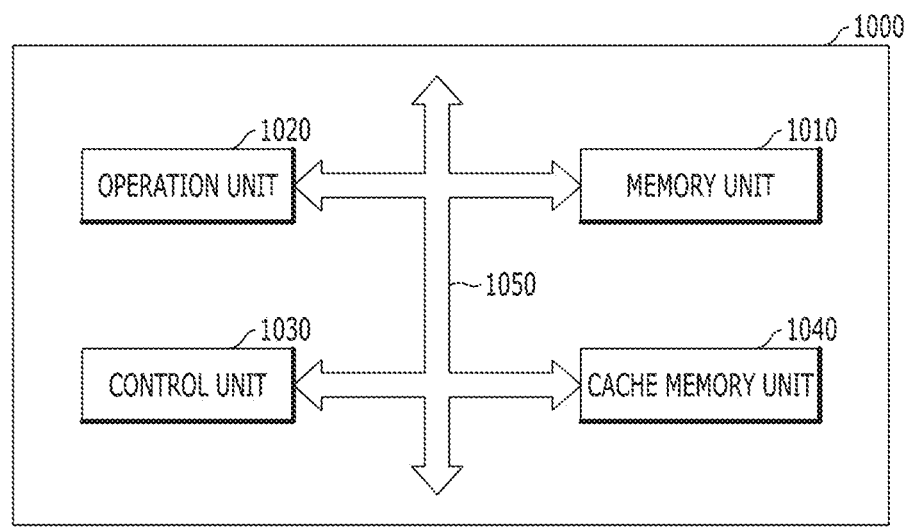
FIG. 14 is an example of configuration diagram of a microprocessor implementing memory circuitry based on the disclosed technology.

FIG. 14 is an example of configuration diagram of a microprocessor implementing memory circuitry based on the disclosed technology.

Referring to FIG. 14, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 15:
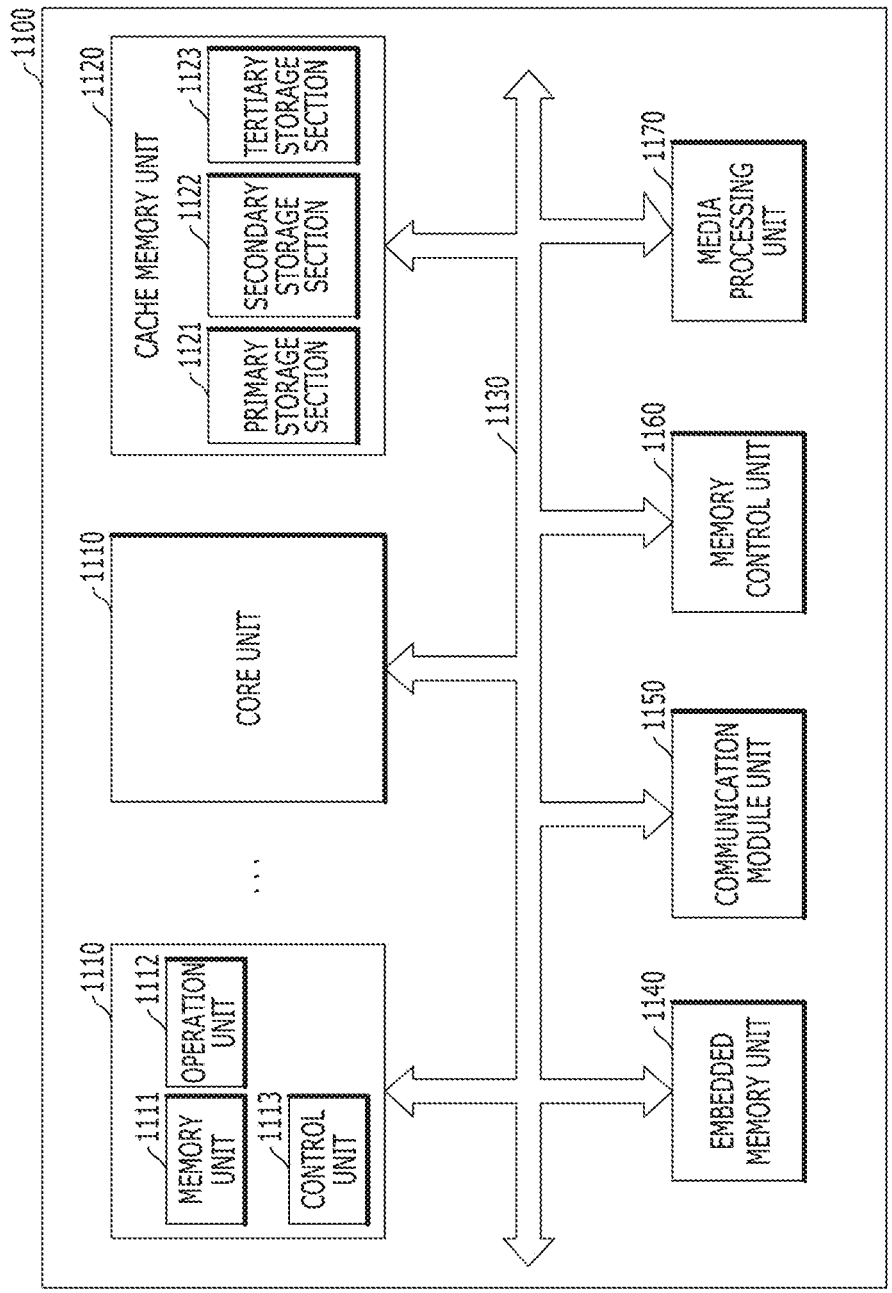
FIG. 15 is an example of configuration diagram of a processor implementing memory circuitry based on the disclosed technology.

FIG. 15 is an example of configuration diagram of a processor implementing memory circuitry based on the disclosed technology.

Referring to FIG. 15, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the cache memory unit 1120 may be improved. As a consequence, operating characteristics of the processor 1100 may be improved.

Although it was shown in FIG. 15 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 16:
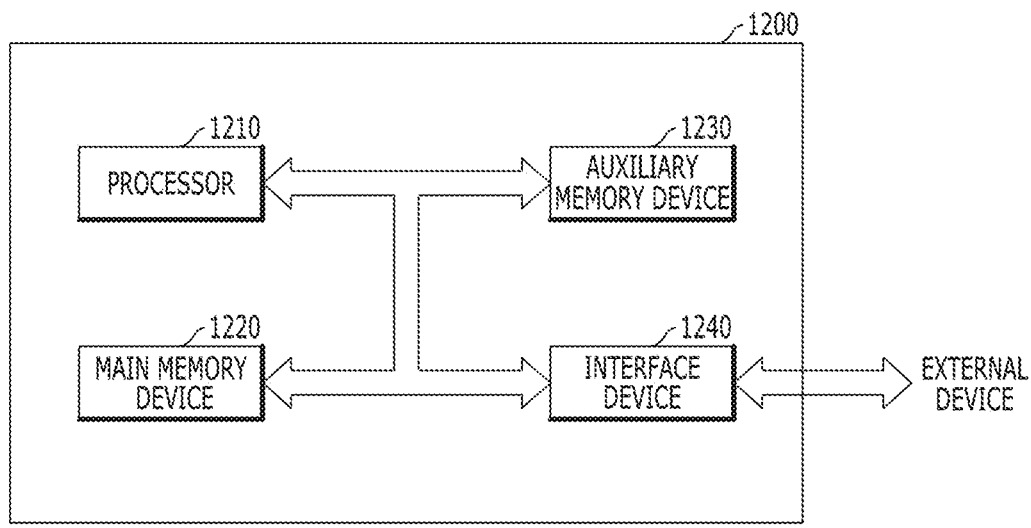
FIG. 16 is an example of configuration diagram of a system implementing memory circuitry based on the disclosed technology.

FIG. 16 is an example of configuration diagram of a system implementing memory circuitry based on the disclosed technology.

Referring to FIG. 16, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 17) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 17) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 17:
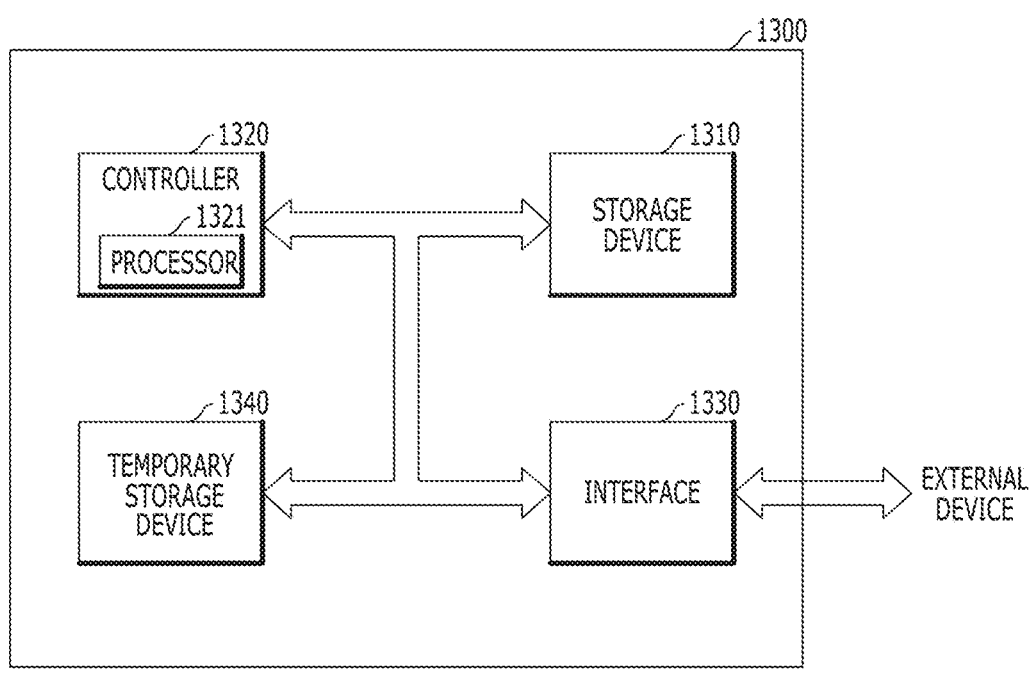
FIG. 17 is an example of configuration diagram of a data storage system implementing memory circuitry based on the disclosed technology.

FIG. 17 is an example of configuration diagram of a data storage system implementing memory circuitry based on the disclosed technology.

Referring to FIG. 17, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the storage device 1310 or the temporary storage device 1340 may be improved. As a consequence, operating characteristics and data storage characteristics of the data storage system 1300 may be improved.

Figure 18:
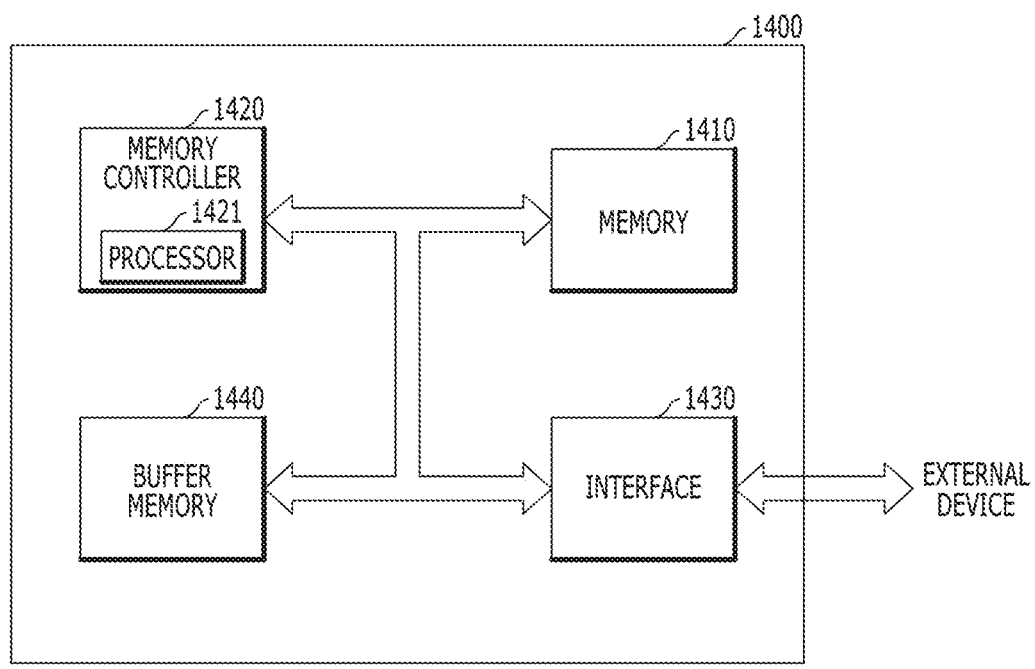
FIG. 18 is an example of configuration diagram of a memory system implementing memory circuitry based on the disclosed technology.

FIG. 18 is an example of configuration diagram of a memory system implementing memory circuitry based on the disclosed technology.

Referring to FIG. 18, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element, wherein the variable resistance element may include: a lower electrode; a spacer formed on a side surface of the lower electrode; and a variable resistance pattern disposed over the lower electrode, wherein a portion of the lower electrode may cover a top surface of the spacer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 14-18 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises a variable resistance element,
   wherein the variable resistance element includes:
   a lower electrode;
   a spacer formed on a side surface of the lower electrode; and
   a variable resistance pattern disposed over the lower electrode,
   wherein a portion of the lower electrode covers a top surface of the spacer.

2. The electronic device of claim 1, wherein the lower electrode includes:
   a lower portion which is in contact with a side surface of the spacer; and
   an upper portion which is in continuity with the lower portion,
   wherein the upper portion is located over the top surface of the spacer and is in contact with the top surface of the spacer.

3. The electronic device of claim 2, wherein a side surface of the upper portion is aligned with a side surface of the variable resistance pattern.

4. The electronic device of claim 2, wherein the spacer has an external sidewall that is recessed.

5. The electronic device of claim 4, wherein the external sidewall has a portion that is aligned with a side surface of the upper portion and a side surface of the variable resistance pattern.

6. The electronic device of claim 1, wherein the lower electrode includes:
   a first lower electrode which is in contact with a side surface of the spacer; and
   a second lower electrode disposed over the first lower electrode,
   wherein a portion of the second lower electrode is in contact with an top surface of the spacer.

7. The electronic device of claim 1, wherein a thickness of an upper portion of the spacer is greater than or equal to that of a lower portion of the spacer.

8. The electronic device of claim 1, wherein the variable resistance pattern includes:
   a first magnetic layer;
   a second magnetic layer disposed over the first magnetic layer;
   a tunnel barrier layer interposed between the first magnetic layer and the second magnetic layer; and
   an upper electrode disposed over the second magnetic layer, wherein the first magnetic layer includes any one of a free layer or a pinned layer, and the second magnetic layer includes the other one of the free layer and the pinned layer.

9. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

10. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

11. The electronic device according to claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

12. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

13. A method for fabricating an electronic device, the method comprising:
configuring a substrate;
forming a lower plug in an interlayer dielectric layer over the substrate, the lower plug being exposed by a hole in the interlayer dielectric layer;
forming a spacer on a sidewall of the hole;
forming a lower electrode in the hole, wherein a portion of the lower electrode covers a top surface of the spacer; and
forming a variable resistance pattern over the lower electrode.

14. The method of claim 13, wherein the forming of the lower electrode includes:
forming a lower portion of the lower electrode, the lower portion being in contact with a side surface of the spacer; and
forming an upper portion of the lower electrode, the upper portion being in continuity with the lower portion,
wherein the upper portion protrudes from the top surface of the spacer and is in contact with the top surface of the spacer.

15. The method of claim 14, wherein a side surface of the upper portion is aligned with a side surface of the variable resistance pattern.

16. The method of claim 14, wherein the spacer has an external sidewall that is recessed.

17. The method of claim 16, wherein the external sidewall has a portion that is aligned with a side surface of the upper portion and a side surface of the variable resistance pattern.

18. The method of claim 13, wherein the forming of the lower electrode includes:
forming a first lower electrode which is in contact with a side surface of the spacer; and
forming a second lower electrode disposed over the first lower electrode,
wherein a portion of the second lower electrode is in contact with a top surface of the spacer.

19. The method of claim 13, wherein a thickness of an upper portion of the spacer is greater than or equal to that of a lower portion of the spacer.

20. The method of claim 13, wherein the forming of the variable resistance pattern includes:
forming a first magnetic layer;
forming a second magnetic layer disposed over the first magnetic layer;
forming a tunnel barrier layer interposed between the first magnetic layer and the second magnetic layer; and
forming an upper electrode disposed over the second magnetic layer,
wherein the first magnetic layer includes any one of a free layer or a pinned layer, and the second magnetic layer includes the other one of the free layer and the pinned layer.

* * * * *